United States Patent
Chun

(10) Patent No.: US 7,166,532 B2
(45) Date of Patent: Jan. 23, 2007

(54) METHOD FOR FORMING A CONTACT USING A DUAL DAMASCENE PROCESS IN SEMICONDUCTOR FABRICATION

(75) Inventor: In Kyu Chun, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/712,740

(22) Filed: Nov. 13, 2003

(65) Prior Publication Data

US 2004/0127023 A1 Jul. 1, 2004

(30) Foreign Application Priority Data

Dec. 30, 2002 (KR) ...................... 10-2002-0086641

(51) Int. Cl.
*H01L 21/4763* (2006.01)
*H01L 21/44* (2006.01)

(52) U.S. Cl. ...................................... 438/637; 438/656

(58) Field of Classification Search ................ 438/627, 438/629, 638, 648, 653, 656, 687
See application file for complete search history.

(56) References Cited

U.S. PATENT DOCUMENTS

| | | | |
|---|---|---|---|
| 5,380,546 A * | 1/1995 | Krishnan et al. | 427/126.1 |
| 5,527,736 A * | 6/1996 | Huang et al. | 438/648 |
| 5,985,751 A * | 11/1999 | Koyama | 438/637 |
| 6,114,243 A * | 9/2000 | Gupta et al. | 438/687 |
| 6,184,128 B1 * | 2/2001 | Wang et al. | 438/637 |
| 6,211,085 B1 * | 4/2001 | Liu | 438/687 |
| 6,537,913 B1 * | 3/2003 | Modak | 438/687 |

(Continued)

FOREIGN PATENT DOCUMENTS

JP 2001-158073 6/2001

(Continued)

OTHER PUBLICATIONS

Narakazu Shimomura; Method for manufacturing semiconductor device: Patent Abstracts of Japan; Jun. 29, 2001; Publication No. JP 2001-176877; Japanese Intellectual Property Office, Japan.

*Primary Examiner*—Lex H. Malsawma
(74) *Attorney, Agent, or Firm*—Andrew D. Fortney

(57) ABSTRACT

A method for forming a contact using a Cu line in semiconductor fabrication process is disclosed. An example method forms a dual damascene pattern by etching a pre-metal dielectric (PMD) layer formed on a substrate. The dual damascene pattern includes a contact hole portion located on the substrate and a trench portion located on the contact hole portion. The width of the contact hole portion is narrower than that of the trench portion. The example method deposits a tungsten diffusion barrier on sidewalls of the damascene pattern, fills the damascene pattern with tungsten by depositing tungsten on the tungsten diffusion barrier to form a tungsten layer and uses chemical mechanical polishing to polish a portion of the tungsten layer over the trench portion. The example method also etches an upper part of the tungsten layer in the trench portion to form a tungsten plug that occupies a lower part of the tungsten layer in the trench portion and the contact hole portion, deposits a Cu diffusion barrier on the tungsten plug, and deposits a Cu on the Cu diffusion barrier.

20 Claims, 6 Drawing Sheets

U.S. PATENT DOCUMENTS

| | | |
|---|---|---|
| 6,706,625 B1 * | 3/2004 | Sudijono et al. ............. 438/637 |
| 6,734,559 B1 * | 5/2004 | Yang et al. ................. 257/751 |
| 2001/0033023 A1 | 10/2001 | Suguro |
| 2003/0139034 A1 * | 7/2003 | Yuang ........................ 438/634 |
| 2004/0005775 A1 * | 1/2004 | Chou et al. ................. 438/653 |
| 2004/0110373 A1 * | 6/2004 | Liu et al. ................... 438/687 |

FOREIGN PATENT DOCUMENTS

| | | |
|---|---|---|
| JP | 2001-176977 | 6/2001 |
| JP | 2001-274248 | 10/2001 |

* cited by examiner

METHOD FOR FORMING A CONTACT USING A DUAL DAMASCENE PROCESS IN SEMICONDUCTOR FABRICATION

FIELD OF THE DISCLOSURE

The present disclosure relates generally to a method for fabricating a semiconductor device and, more particularly, to a method for forming a contact of the semiconductor device having a Cu line by using a dual damascene process.

BACKGROUND

The demand for semiconductor devices having a Cu line has been increasing due to the low resistance of the Cu line. As a result, various types of semiconductor devices having a Cu line have been recently developed. Cu lines are usually deposited on a copper seed layer (e.g., a Ta(Tantalum)/TaN (Tantalum nitride) double layer), which also serves as a Cu diffusion barrier that prevents copper in the Cu line from being diffused, by a dual damascene process.

However, the contacts of semiconductor devices are usually implemented using a tungsten plug (W-plug) fabricated using a single damascene process instead of a dual damascene process, which is usually used to form the Cu line and a via hole.

To form the tungsten plug, both a tungsten CMP (chemical mechanical polishing) process and a touch-up process, which is a follow-up process to the tungsten CMP process, are required. However, in the course of the touch-up process, wafer surfaces are often scratched microscopically and macroscopically and insulating layers are often ripped out by oxide particles.

Moreover, the Ta/TaN double layer, which serves as the Cu diffusion barrier at an interface between the tungsten plug and the Cu line, may collapse in the course of a Cu CMP process due to a void (i.e., a vacant region in the tungsten plug) generated during a tungsten CVD (chemical vapor deposition) process.

FIGS. 1A to 1F show a conventional method for forming a contact using the tungsten plug and the single damascene process, sequentially. As shown in FIG. 1A, a PMD (premetal dielectric) layer 102 is photo-lithographically etched to form a contact hole 104. Thereafter, as shown in FIG. 1B, a tungsten diffusion barrier 106 (e.g., a Ti(Titanium)/TiN (Titanium nitride) double layer) is deposited on the PMD layer 102 and sidewalls and an undersurface of the contact hole 104, and then a tungsten layer 108 is deposited on the tungsten diffusion barrier 106 by the tungsten CVD process.

In the course of the CVD process, the tungsten layer 108 begins to grow from the sidewalls of the contact hole 104 so that the void can be produced at the center of the contact hole 104.

Then, as shown in FIG. 1C, the tungsten layer 108 and the tungsten diffusion barrier 106 above the PMD layer 102 are removed by the tungsten CMP process and the touch-up process to form a tungsten plug 109, which has substantially the same height as that of the PMD layer 102. The tungsten layer 108 is polished by the tungsten CMP process and, tungsten residue, which was not completely removed during the tungsten CMP process, is removed by the touch-up process (e.g., an oxide CMP process). Thereafter, as shown in FIG. 1D, an additional PMD layer 103 is deposited on both sides of the PMD layer 102 to form a trench 110 having a width greater than that of the tungsten plug 109.

Then, as shown in FIG. 1E, a Cu diffusion barrier 11 (e.g., a Ta/TaN double layer) is deposited on the additional PMD layer 103 and sidewalls and an undersurface of the trench 110, and then copper 112 is deposited on the Cu diffusion barrier 111. Then, as shown in FIG. 1F, the copper 112 over the trench 110 is removed by a Cu CMP process to form a Cu line 113.

The above-described conventional method must utilize the touch-up process because the additional PMD layer 103 should be deposited on a clean surface of the PMD layer 102 to reduce a leakage current that may be caused by tungsten residue remaining at an interface of the PMD layers 102 and 103. However, as noted above, the wafer surfaces may be scratched microscopically and macroscopically and the insulating layers may be ripped out during the touch-up process.

Further, with the above-described conventional method, the void can be exposed after the tungsten CMP process or the touch-up process so that the Cu diffusion barrier 111 cannot be deposited over the void. Thus, in the course of the Cu CMP process, the copper in the Cu line 113 can be diffused to the silicon substrate 100 via the tungsten diffusion barrier 106 which cannot serve as the Cu diffusion barrier. Even if the void is not exposed after the tungsten CMP process or the touch-up process, the Cu diffusion barrier 111 may collapse to thereby expose the void by a pressure exerted during the Cu CMP process, so that the copper in the Cu line 113 can be diffused to the silicon substrate 100 via the tungsten diffusion barrier 106 in the same way.

Still further, with the above-described conventional method, the contact resistance between the tungsten plug 109 and the Cu line 113 is high because the width of the contact region therebetween is narrow.

DETAILED DESCRIPTION

As described in greater detail below, an example method for forming a contact of a semiconductor device having a Cu line uses a dual damascene process to reduce scratches on wafer surfaces, reduce a rip-out defect at an insulating layer, release a diffusion phenomenon of a copper due to collapse of a Cu diffusion barrier, and to reduce a contact resistance between a tungsten plug and the Cu line.

Figure 2A:
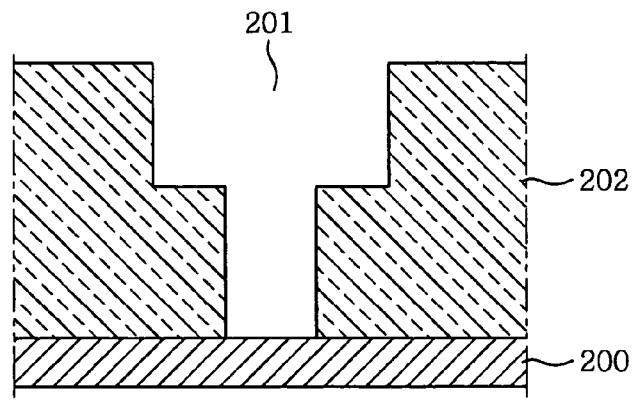
FIGS. 2A to 2G depict an example method for forming a contact using dual damascene process during fabrication of a semiconductor.
Figure 2B:
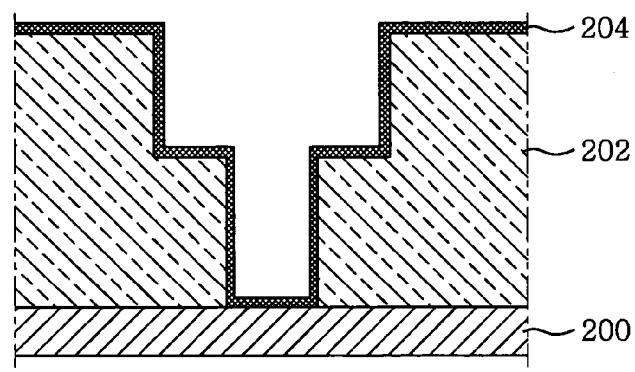

FIGS. 2A to 2G depict an example method for forming a contact by using a dual damascene process during fabrication of a semiconductor. As shown in FIG. 2A, a PMD layer 202 is photo-lithographically etched to form a dual damascene pattern 201. The dual damascene pattern 201 includes a contact hole portion located at a lower part thereof and a trench portion located at a upper part thereof. The underside of the contact hole portion is in contact with a silicon substrate 200. Because the width of the trench portion is wider than that of the contact hole portion, the underside of the trench portion is in contact with the contact hole portion and the PMD layer 202. Then, as shown in FIG. 2B, a tungsten diffusion barrier 204 (e.g., a Ti/TiN double layer) is deposited on the dual damascene pattern 201 (i.e., on the PMD layer 202) on sidewalls of the contact hole portion and the trench portion and on the underside of the contact hole portion and the trench portion. It is preferable that the thickness of Ti/TiN is 30/5 nm.

Figure 2C:
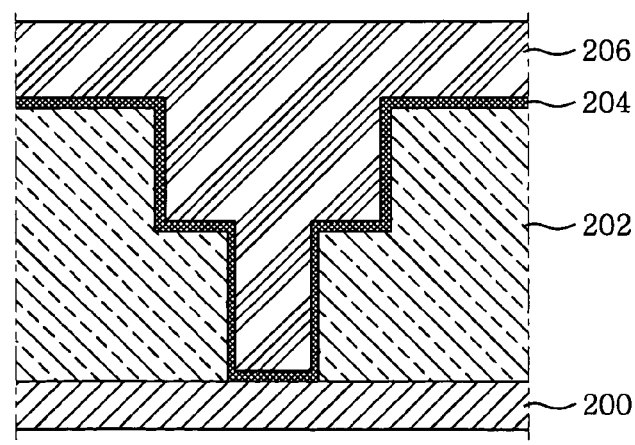

Thereafter, as shown in FIG. 2C, a tungsten layer 206 is deposited on the tungsten diffusion barrier 204 by a tungsten CVD (chemical vapor deposition) process to fill the contact hole portion and the trench portion.

Figure 1A:
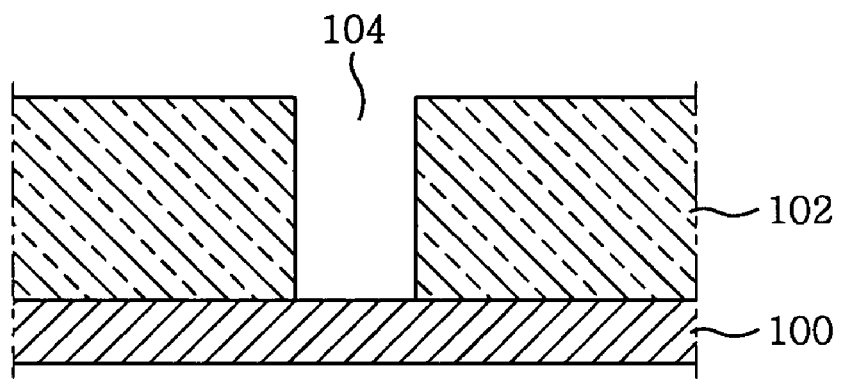
FIGS. 1A to 1F show a conventional method for forming a contact during a semiconductor fabrication process.
Figure 1B:
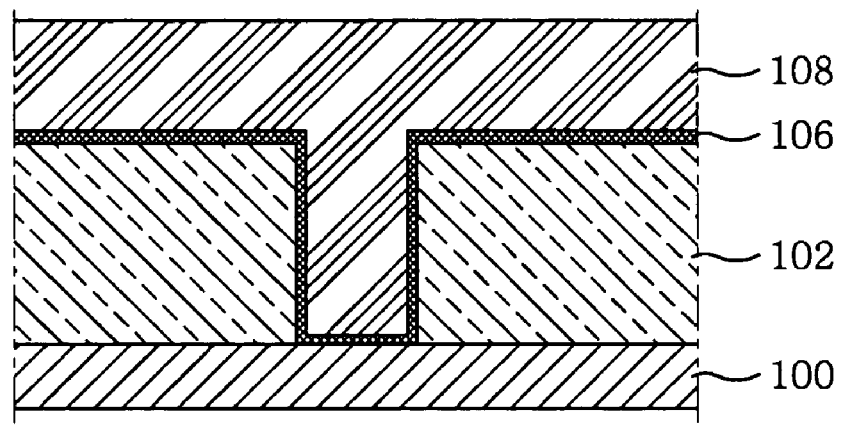
Figure 1C:
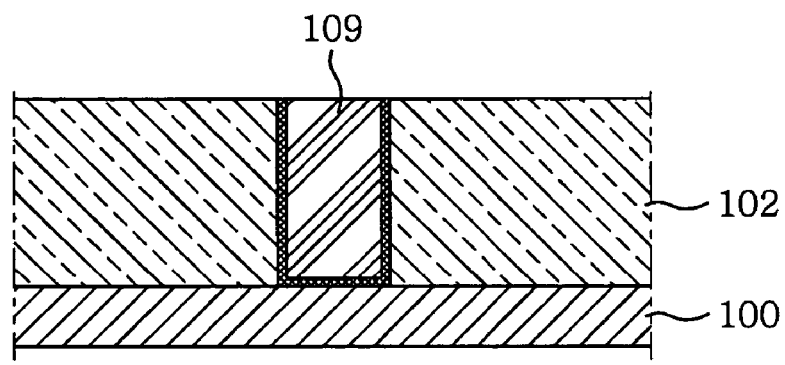
Figure 1D:
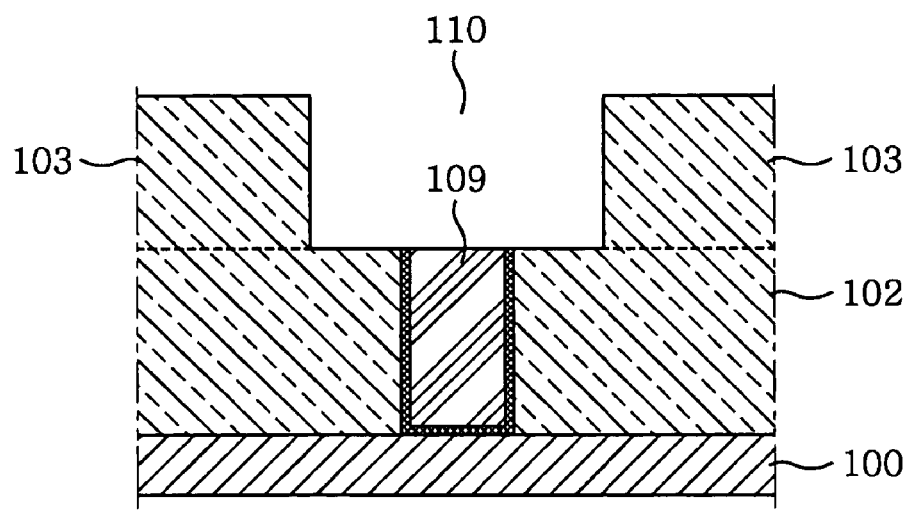
Figure 1E:
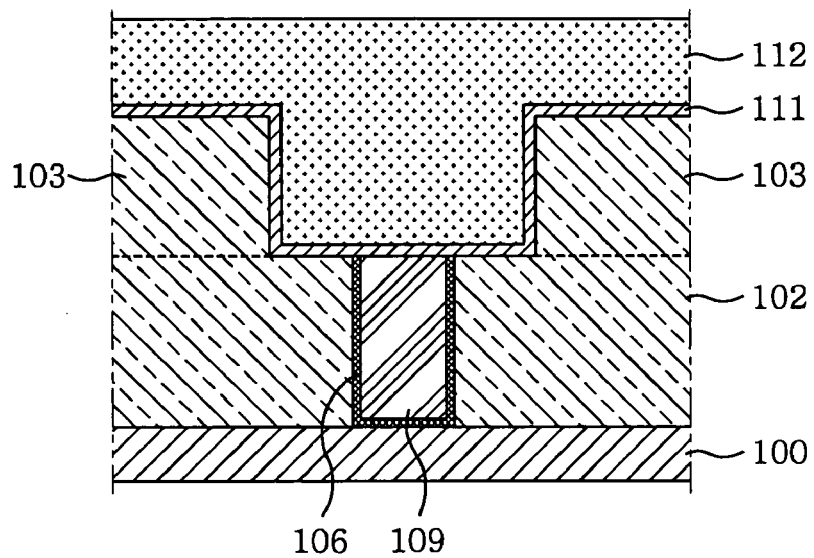
Figure 1F:
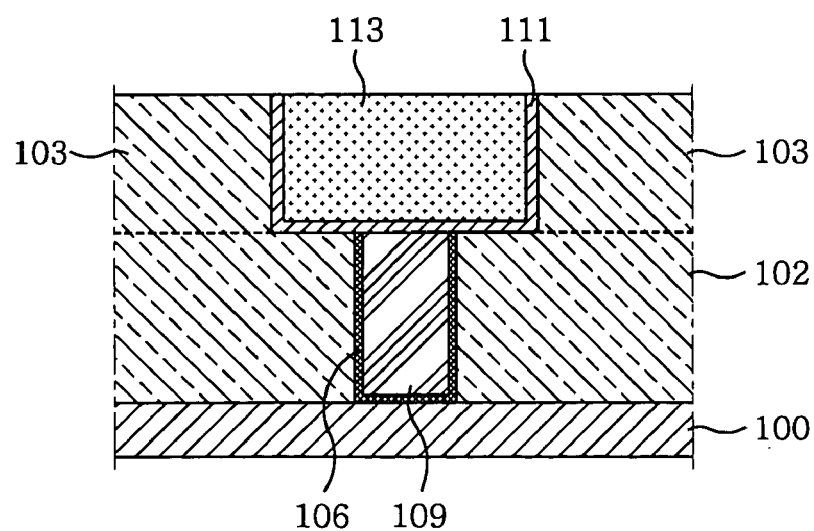
Figure 2D:
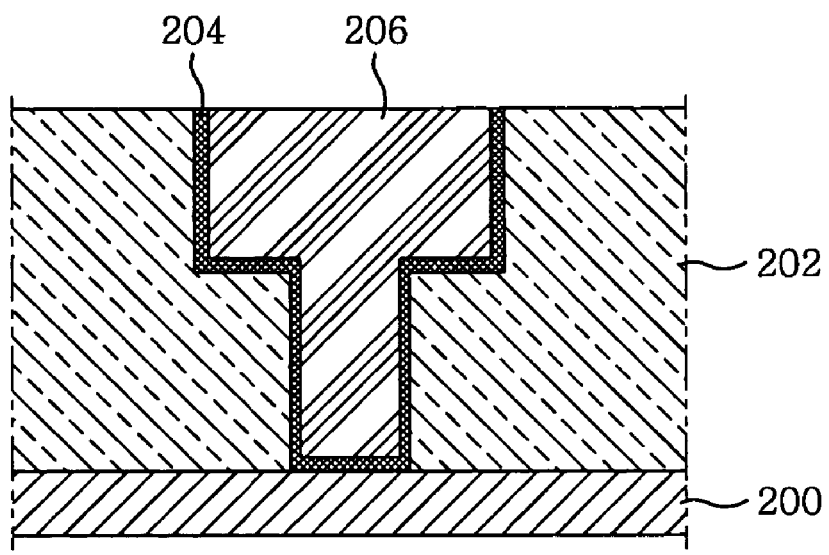
Figure 2E:
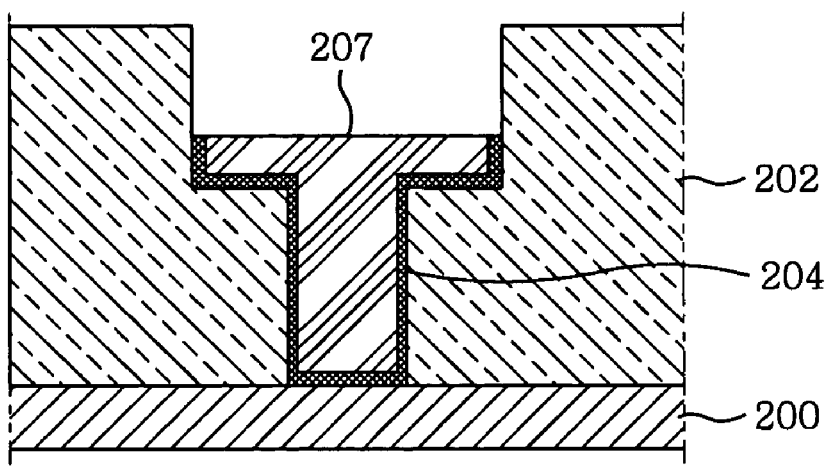

Then, the tungsten layer 206 outside of the trench portion is removed as shown in FIG. 2D and an upper part of the tungsten layer 206 in the trench portion is removed as shown in FIG. 2E, by a dry etching process, to form a tungsten plug 207. Thus, the tungsten plug 207 occupies the contact hole portion and the lower part of the trench portion so that a void, i.e., a vacant region in the contact hole portion, generated during the tungsten CVD process, cannot be exposed. It is preferable that the height of the tungsten plug 207 is 300 nm and the diameters of tungsten plug 207 in the contact hole portion and in the lower part of the trench portion are 185 nm and 500 nm, respectively. Furthermore, because there is no need to deposit an additive layer, such as an additive PMD layer 103 of FIG. 1D, on the PMD layer 202, a touch-up process is not required at the time the tungsten layer 206 is removed. Because there is no touch-up process, the wafer surfaces cannot be scratched thereby.

Figure 2F:
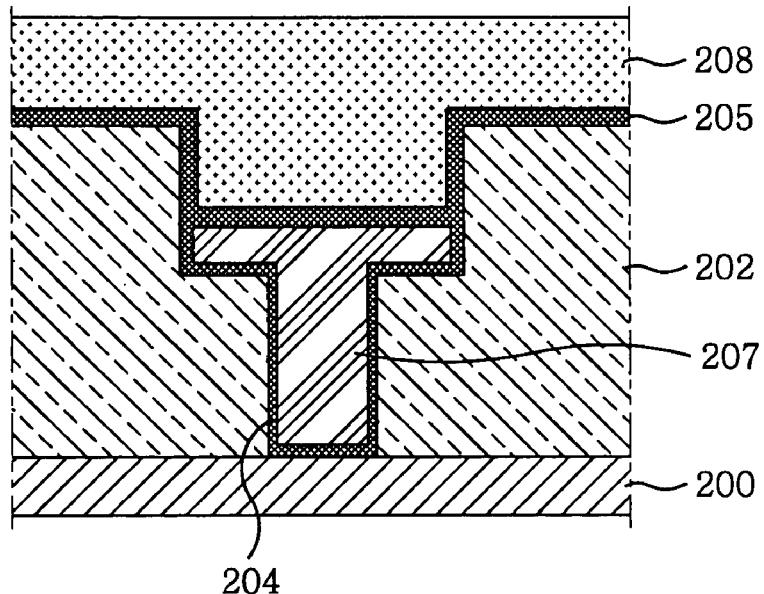
Figure 2G:
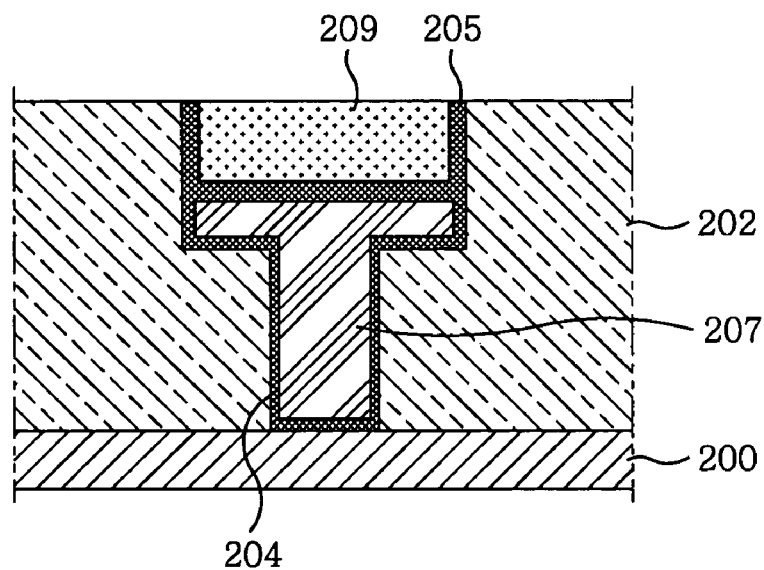

Thereafter, as shown in FIG. 2F, a Cu diffusion barrier 205, e.g., a Ta/TaN double layer, is deposited on the PMD layer 202 and on the tungsten plug 207. It is preferable that the thickness of Ta/TaN is 7.7/7.5 nm. Beacuse the void in the contact hole portion is not exposed, the Cu diffusion barrier 205 can be deposited on the whole surface of the tungsten plug 207. Then a copper layer 208 is deposited on the Cu diffusion barrier 205 and, as shown in FIG. 2G, the copper layer 208 outside of the trench portion is then removed by a Cu CMP process to form a Cu line 209. It is preferable that the height of the Cu line 209 is 250 nm.

In spite of a pressure exerted by the Cu CMP process, the Cu diffusion barrier 205 does not collapse easily because the void in the contact hole portion is not exposed by the tungsten plug 207 and the Cu diffusion barrier 205 can be deposited on the whole surface of the tungsten plug 207.

Additionally, a contact resistance between the tungsten plug 207 and the Cu line 209 is lower than that of the conventional method described in connection with FIG. 1 because the width of an interface between the tungsten plug 207 and the Cu line 209 is wide.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method for forming a contact using a Cu line in semiconductor fabrication, comprising:
   forming a dual damascene pattern by etching a pre-metal dielectric (PMD) layer formed on a substrate, wherein the dual damascene pattern includes a contact hole portion located on the substrate and a trench portion located on the contact hole portion, the width of the contact hole portion being narrower than that of the trench portion;
   depositing a tungsten diffusion barrier on sidewalls of the damascene pattern;
   completely filling the damascene pattern with tungsten by depositing tungsten on the tungsten diffusion barrier to form a tungsten layer;
   chemical mechanical polishing a portion of the tungsten layer over the trench portion;
   etching an upper part of the tungsten layer in the trench portion so as to not expose a void in the contact hole portion, thereby forming a tungsten plug that occupies a lower part of the tungsten layer in the trench portion and the contact hole portion;
   depositing a Cu diffusion barrier on the tungsten plug;
   depositing a Cu on the Cu diffusion barrier; and
   removing a portion of the Cu outside of the trench portion by a Cu chemical mechanical polishing process.

2. A method as defined in claim 1, wherein etching the tungsten in the trench portion does not expose the tungsten in the contact hole portion.

3. A method as defined in claim 2, wherein the tungsten diffusion barrier includes a titanium layer and a titanium nitride layer.

4. A method as defined in claim 3, wherein the Cu diffusion barrier includes a tantalum layer and a tantalum nitride layer.

5. A method as defined in claim 4, wherein the tungsten diffusion barrier comprises a Ti/TiN double layer.

6. A method as defined in claim 5, wherein the Ti/TiN has a thickness of 30/5 nm.

7. A method as defined in claim 5, wherein the Cu diffusion barrier comprises a Ta/TaN double layer.

8. A method as defined in claim 7, wherein the Ta/TaN has a thickness of 7.7/7.5 nm.

9. A method as defined in claim 7, wherein the Ti/TiN double layer is thicker than the Ta/TaN double layer.

10. A method for forming a Cu line, comprising:
    etching a dielectric layer on a substrate to form a dual damascene pattern including a contact hole portion on the substrate and a trench portion on the contact hole portion, the width of the contact hole portion being narrower than that of the trench portion;
    depositing a first diffusion barrier layer on sidewalls of the dual damascene pattern;
    depositing tungsten on the first diffusion barrier to completely fill the dual damascene pattern with tungsten;
    removing part of the tungsten in the trench portion so as to not expose tungsten in the contact hole portion;
    depositing a second diffusion barrier layer on the unremoved tungsten;
    depositing Cu on the second diffusion barrier layer; and
    chemical mechanical polishing the Cu outside of the trench portion.

11. A method as defined in claim 10, wherein removing part of the tungsten in the trench portion comprises chemical mechanical polishing a portion of the tungsten over the trench portion, and etching an upper part of the tungsten layer in the trench portion so as to not expose tungsten in the contact hole portion, thereby forming a tungsten plug in the contact hole portion and in a lower part of in the trench portion.

12. A method as defined in claim 10, wherein the first diffusion barrier layer prevents diffusion of tungsten.

13. A method as defined in claim 12, wherein the second diffusion barrier layer prevents diffusion of Cu.

14. A method as defined in claim 13, wherein the second diffusion barrier layer comprises a Ta/TaN double layer.

15. A method as defined in claim 14, wherein the Ta/TaN has a thickness of 7.7/7.5 nm.

16. A method as defined in claim 12, wherein the first diffusion barrier layer comprises a Ti/TiN double layer.

17. A method as defined in claim 16, wherein the Ti/TiN has a thickness of 30/5 nm.

18. A method as defined in claim 10, wherein the first diffusion barrier layer includes a titanium layer and a titanium nitride layer.

19. A method as defined in claim 18, wherein the second diffusion barrier layer includes a tantalum layer and a tantalum nitride layer.

20. A method as defined in claim 19, wherein the titanium and titanium nitride layers have a combined thickness greater than a combined thickness of the tantalum and tantalum nitride layers.

* * * * *